Sept. 27, 1966 M. P. LEPSELTER 3,274,670

SEMICONDUCTOR CONTACT

Filed March 18, 1965

INVENTOR
M. P. LEPSELTER
BY H W Lockhart
ATTORNEY

3,274,670
SEMICONDUCTOR CONTACT

Martin P. Lepselter, New Providence, N.J., assignor to Bell Telephone Laboratories, Incorporated, New York, N.Y., a corporation of New York Filed Mar. 18, 1965, Ser. No. 440,782
3 Claims. (Cl. 29—155.5)

Figure 1:
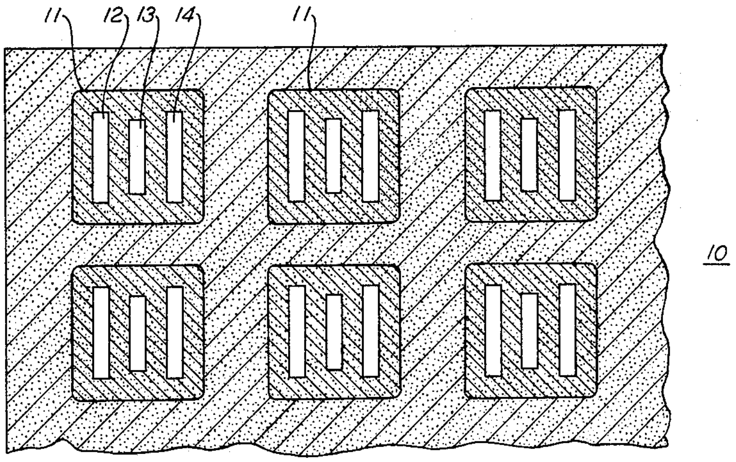

This application is a continuation-in-part of my application, Serial No. 331,168, filed December 17, 1963. The invention relates particularly to a method of making low resistance electrical contact to semiconductor devices.

In my application, referred to above, there is disclosed a technique for forming a particularly satisfactory ohmic contact to silicon semiconductor material by depositing a thin layer of platinum, which is then heat treated briefly to cause a solid phase reaction resulting in the formation of a platinum silicide having a high degree of adherence and intimate contact electrically to the silicon. The invention disclosed herein is based on this technique with certain refinements and variations.

In particular, an object of this invention is to facilitate the making of low resistance contacts to germanium and silicon semiconductor material.

Another object of this invention is to enable a determination as to whether good ohmic contact has been made to a semiconductor device at an early stage in the fabrication without the need for electrical testing.

Generally in the fabrication of semiconductor devices, particularly of the planar, diffused junction type, metal contact layers are deposited on surface portions of the semiconductor material as defined by oxide masked areas. A wide variety of metals have been found satisfactory for making low resistance or substantially ohmic contact in this manner. However, it is a general practice that a determination of whether a satisfactory ohmic connection has been made is not available until the devices are substantially completely fabricated and after a suitable electrical test. Thus the devices may have to be discarded as unsatisfactory after having been subjected to considerable lengthy and costly processes.

In accordance with the method of this invention a thin layer of a metal of the type capable of forming a compound with the semiconductor material by reason of a solid phase reaction is deposited over the surfaces to which ohmic connection is desired. Generally in the case of a slice of semiconductor material which has been diffused and prepared by oxide masking for contact on selected areas, the metal layer is deposited upon the entire surface including over the oxide film. Typically, a metal such as platinum is deposited to a thickness of 700 Angstroms on silicon semiconductor material. It is then heated to a temperature sufficient to cause the solid phase reaction noted above, which in the case of platinum and silicon is about 700 degrees centigrade for a period of several minutes. At this juncture the slice, if viewed through a microscope in bright light, will exhibit a generally silvery or reflective surface over all of its areas on which the metal has been deposited except for those portions in which the metal has been converted to the compound. Thus, those portions comprising, in this example, platinum silicide will have a lower reflectivity and consequently will appear somewhat darker than the unconverted metal areas. Inasmuch as this compound affords the basis of a good contact, the formation or nonformation of satisfactory ohmic contacts may be determined at this stage of the process, before any further fabrication.

Figure 2:
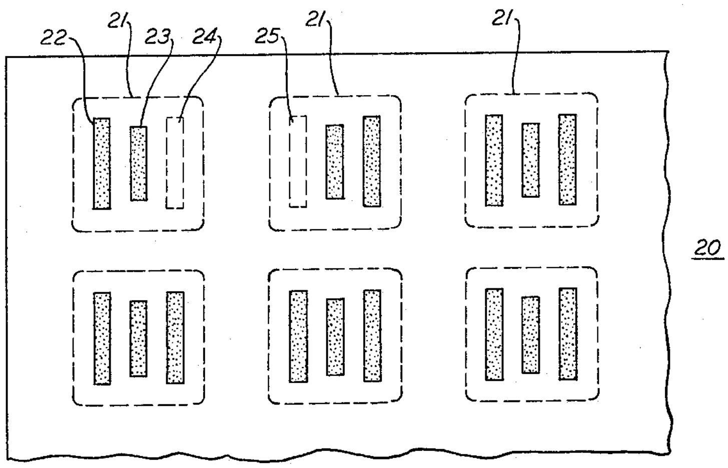

The invention and its other objects and features will be better understood from the following more detailed description taken in conjunction with the drawing in which:

FIGS. 1 and 2 show plan views of a portion of a semiconductor slice at stages in the fabrication of low resistance contacts in accordance with this invention.

In FIG. 1 there is shown a portion 10 of a slice of silicon semiconductor material. The rectangular areas 11 represent diffused base regions which have been fabricated by well-known oxide masking and diffusion techniques. Within each diffused base area are three rectangular areas defining the base and emitter electrodes. In particular, the center electrode 13 is almost coincident, but somewhat smaller than a diffused emitter region not shown, but also produced by oxide masking and diffusion. Following these two diffusion operations the silicon oxide film on the surface of the slice is entirely re-constituted. Next, the areas 12 and 14, corresponding to the base contacts and area 13, defining the emitter contact, are opened to the underlying silicon surface by photoresist and etching techniques.

Consequently, in the structure shown in FIG. 1 the entire surface of the slice portion 10 is covered with an oxide film except for the three electrode areas of each separate transistor structure. In the drawing the areas of the original or collector region of the slice are slightly different in color from the diffused base areas because of the slightly different oxide thicknesses on these portions. Thus for ease of understanding this color difference is depicted by distinctive cross-hatching. However, it should be understood that the surface of the slice is substantially planar.

Upon this partially masked surface of the slice a film of platinum is deposited to a thickness of about 700 Angstroms. One satisfactory method for producing this film is by cathodic sputtering. However, vacuum evaporation from a hot filament or crucible may also be used. Moreover, the deposition of the entire thicknesses need not be completed in a single operation but may be done in successive steps with intervening heat treatments. Thus, in one embodiment a layer of 300 Angstroms of platinum is deposited followed by a two minute treatment at 700 degrees centigrade, followed by another 300 Angstrom layer and another two minute heat treatment at 700 degrees centigrade and finally a deposition of 150 Angstroms with a final five minute heat treatment at 700 degrees centigrade. However, equally satisfactory results may be secured by depositing the total 700 Angstroms at one time and heating at 700 degrees centigrade for from five to ten minutes.

Alternatively, the metal may be deposited directly on a relatively hot substrate which is heated either by radiation from a filament or by the use of a strip heater. In this case the solid phase reaction occurs more or less as the deposition is carried out. In particular, where vacuum evaporation from a hot filament is employed sufficient radiation is often available to produce the necessary heat for the substrate.

After the foregoing deposition and heat treatment the semiconductor slice material will have an appearance as exemplified by the structure shown in FIG. 2. In this particular illustration two of the electrode areas are shown as having failed to produce the desired solid phase reactions which provide the basis for good ohmic contact. Thus the slice portion 20 when viewed under a microscope and illuminated by bright light will show a generally silvery or bright appearance over the entire area except for the platinum silicide electrode stripes which will have a lower reflectivity and consequently appear as a gray area. However, in those portions in which the platinum silicide has not formed by reason of failure of the deposited metal to make good contact to the silicon, from the presence of contamination or other reason, the gray appearance will be lacking.

For example, in the upper left and upper center devices base electrode 22 and emitter electrode 23 show the formation of the silicide indicating that good ohmic contact will result. On the other hand, although the boundary of the oxide mask can be seen slightly, such a darkened area has not formed for the base electrodes 24 and 25. Thus, it is possible to decide at this juncture either that the devices resulting from these two portions should be discarded at the earliest point in the subsequent fabrication or if a large number of such unsatisfactory areas occur to reprocess the entire slice.

In order to complete the formation of the ohmic contacts to the devices on this slice of semiconductor material the slice is treated with an etchant, such as an aqua regia solution, which attacks platinum but does attack the platinum silicide. One suitable mixture using standard commercial acid solutions comprises eight parts by volume of hydrochloric acid to one part by volume of nitric acid. Thus the remaining metal is readily removed from the slice surface. Subsequently, as disclosed in my parent application, a composite layer of platinum, titanium and gold is deposited over the platinum silicide areas.

In the above specific embodiment heat treatment at about 700 degrees centigrade is suggested. If lower temperatures are used, longer heating times will be required.

It is also within the skill of the art to utilize other etchant mixtures than the particular aqua regia solution set forth herein.

Accordingly, although the invention has been described in terms of specific embodiments, it should be understood that variations may be devised by those skilled in the art which are within the scope and spirit of the invention.

What is claimed is:

1. The method of making low resistance contact to a body of semiconductor material of silicon comprising forming an oxide mask on a portion of the surface of said semiconductor body, depositing on said surface a layer of platinum, heating said body at a temperature and for a time sufficient to produce a solid phase reaction between the platinum and said semiconductor to form a compound of platinum and said semiconductor which has a lower light reflectivity than platinum of such degree as to enable visual determination of the formation of said compound on the unmasked portions of said surface and which is insoluble in aqua regia, treating said surface with an aqua regia solution to remove the remaining platinum areas leaving the compound portions in place, and applying additional metal layers to said compound portions to complete the contacts.

2. The method in accordance with claim 1 in which the platinum deposition is done in more than one step, with heating between depositions.

3. The method in accordance with claim 1 in which the thickness of deposited platinum is about 700 Angstrom units and the heating is about 700 degrees centigrade for about ten minutes.

References Cited by the Examiner

UNITED STATES PATENTS

| | | | |
|---|---|---|---|
| 2,793,420 | 5/1957 | Johnston | 29—155.5 |
| 2,973,466 | 2/1961 | Atalla | 317—240 |
| 3,046,176 | 7/1962 | Bosenberg | 29—155.5 |
| 3,138,743 | 6/1964 | Kilby. | |
| 3,169,892 | 2/1965 | Lemelson | 29—155.7 X |

JOHN F. CAMPBELL, *Primary Examiner.*

WHITMORE A. WILTZ, *Examiner.*

W. I. BROOKS, *Assistant Examiner.*